(12) United States Patent
Hsu et al.

(10) Patent No.: US 11,404,394 B2
(45) Date of Patent: Aug. 2, 2022

(54) CHIP PACKAGE STRUCTURE WITH INTEGRATED DEVICE INTEGRATED BENEATH THE SEMICONDUCTOR CHIP

(71) Applicant: Taiwan Semiconductor Manufacturing Co., Ltd., Hsinchu (TW)

(72) Inventors: Feng-Cheng Hsu, New Taipei (TW); Shin-Puu Jeng, Hsinchu (TW); Shuo-Mao Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/922,132

(22) Filed: Jul. 7, 2020

(65) Prior Publication Data

US 2021/0074678 A1 Mar. 11, 2021

Related U.S. Application Data

(60) Provisional application No. 62/897,458, filed on Sep. 9, 2019.

(51) Int. Cl.
*H01L 25/065* (2006.01)
*H01L 25/00* (2006.01)
*H01L 23/00* (2006.01)

(52) U.S. Cl.
CPC .......... *H01L 25/0652* (2013.01); *H01L 24/13* (2013.01); *H01L 24/81* (2013.01); *H01L 25/50* (2013.01); *H01L 2924/14* (2013.01)

(58) Field of Classification Search
CPC ..... H01L 25/0652; H01L 25/50; H01L 24/13; H01L 24/81; H01L 2924/14; H01L 24/73
See application file for complete search history.

(56) References Cited

U.S. PATENT DOCUMENTS

| 9,418,966 B1* | 8/2016 | Kwon | H01L 21/568 |
| 9,859,245 B1* | 1/2018 | Chen | H01L 21/561 |
| 2008/0237846 A1* | 10/2008 | Terui | H01L 23/42 257/717 |
| 2010/0213599 A1* | 8/2010 | Watanabe | H01L 24/24 257/693 |
| 2010/0327466 A1* | 12/2010 | Drost | B81C 3/008 257/785 |
| 2011/0024906 A1* | 2/2011 | Meyer | H05K 1/185 257/738 |
| 2011/0244628 A1* | 10/2011 | Ode | H01L 21/67126 438/109 |

(Continued)

FOREIGN PATENT DOCUMENTS

| CN | 102280418 A | * 12/2011 | ......... H01L 25/0657 |
| KR | 20120033006 A | * 4/2012 | ......... H01L 2224/16 |
| TW | 201624636 A | 7/2016 | |

*Primary Examiner* — Douglas W Owens
(74) *Attorney, Agent, or Firm* — McClure, Qualey & Rodack, LLP (57) ABSTRACT

A package structure and a method of forming the same are provided. The package structure includes a package substrate, a semiconductor chip over the package substrate, and at least one integrated device integrated with the semiconductor chip. The integrated device is integrated directly beneath the semiconductor chip in order to facilitate signal transmission.

20 Claims, 11 Drawing Sheets

(56) References Cited

U.S. PATENT DOCUMENTS

| | | | |
|---|---|---|---|
| 2013/0113108 A1* | 5/2013 | Wang | H01L 25/03 257/772 |
| 2014/0353791 A1* | 12/2014 | Jain | H01L 31/048 257/434 |
| 2017/0317058 A1* | 11/2017 | Chen | H01L 25/03 |
| 2021/0242185 A1* | 8/2021 | Yazdani | H01L 23/66 |

* cited by examiner

CHIP PACKAGE STRUCTURE WITH INTEGRATED DEVICE INTEGRATED BENEATH THE SEMICONDUCTOR CHIP

PRIORITY CLAIM AND CROSS-REFERENCE

This Applications claims the benefit of U.S. Provisional Application No. 62/897,458, filed on Sep. 9, 2019, the entirety of which is incorporated by reference herein.

BACKGROUND

Integrated circuits (ICs) are made practical by technological advancements in semiconductor device fabrication. The size, speed, and capacity of chips have progressed enormously, driven by technical advances that fit more and more elements on chips of the same size. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

Although existing packaging techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1A:
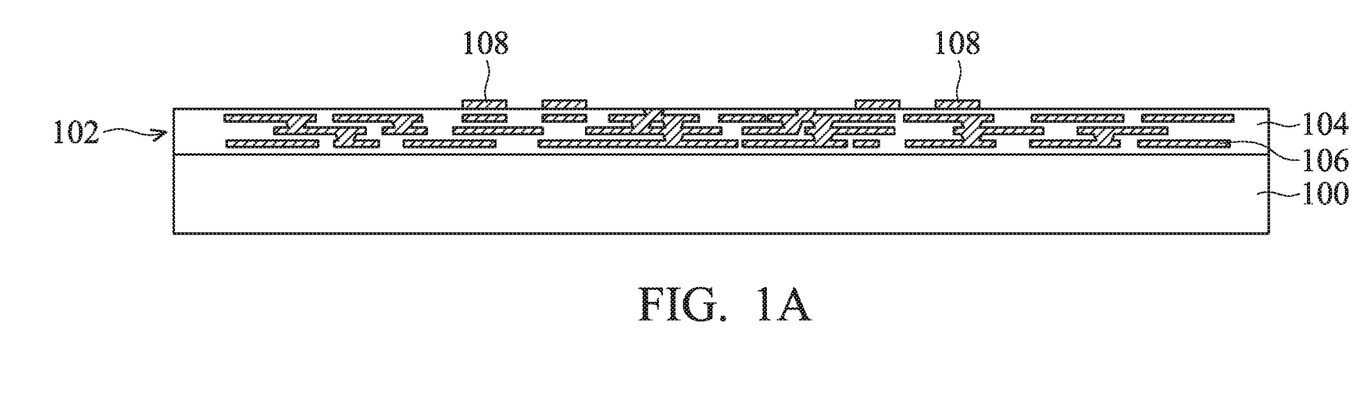
FIGS. 1A-1E are cross-sectional views of various stages of a process for forming a package structure, in accordance with some embodiments.

FIGS. 1A-1E are cross-sectional views of various stages of a process for forming a package structure, in accordance with some embodiments. As shown in FIG. 1A, a package substrate 102 is formed over a carrier substrate 100, in accordance with some embodiments. The carrier substrate 100 may be a glass substrate, semiconductor substrate, or another suitable substrate. The package substrate 102 may be used to provide electrical connection between the semiconductor devices (which will be described later) packaged in the package structure and an external electronic device, after the carrier substrate 100 is removed at a subsequent stage (illustrated in FIG. 1E).

The package substrate 102 may be used for routing. In some embodiments, the package substrate 102 is a redistribution substrate. In some alternative embodiments, the package substrate 102 is a build-up substrate including a core and build-up layers on opposing sides of the core. In the subsequent discussion of the embodiments of the present disclosure, a redistribution substrate is illustrated as an example of the package substrate 102, while the teaching revealed in accordance with the example embodiments are readily applicable for build-up substrates. The package substrate 102 includes multiple laminated insulating layers 104 and multiple conductive features 106 surrounded by the insulating layers 104, as shown in FIG. 1A. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric materials may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the package substrate 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

As shown in FIG. 1A, the package substrate 102 also includes conductive elements 108 formed thereon, in accordance with some embodiments. Each conductive element 108 may be exposed at or protruding from the topmost surface of the insulating layers 104, and may be electrically connected to one of the conductive features 106. The conductive elements 108 may be used to electrically conducted to, hold or receive semiconductor chips, which will be described later.

The conductive elements 108 may be made of or include copper, aluminum, gold, cobalt, titanium, tin, one or more other suitable materials, or a combination thereof. The conductive elements 108 may be formed using an electroplating process, an electroless plating process, a placement process, a printing process, a physical vapor deposition (PVD) process, a chemical vapor deposition (CVD) process, a photolithography process, one or more other applicable processes, or a combination thereof.

Figure 1B:
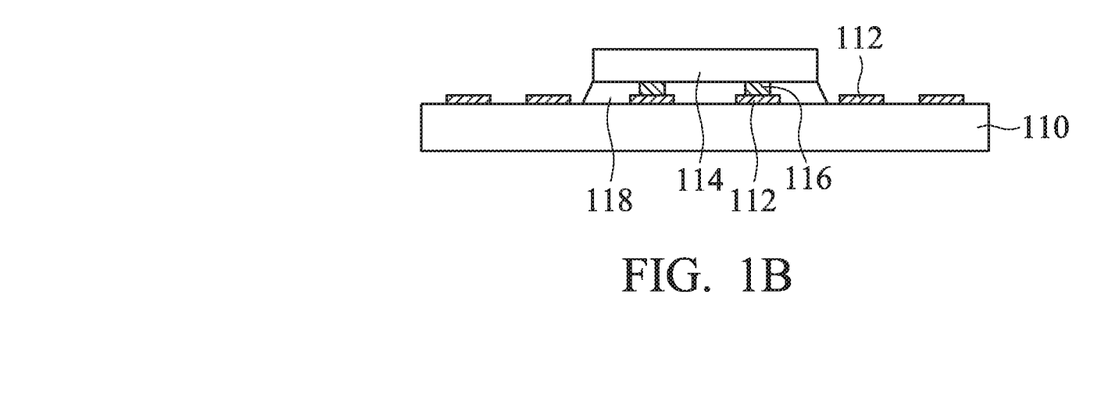

As shown in FIG. 1B, one or more semiconductor chips 110 (for simplicity, only one semiconductor chip 110 is shown) are provided over the package substrate 102 (in FIG. 1A), in accordance with some embodiments. In the present embodiment, each semiconductor chip 110 is a surface-mount device (SMD) having contact pads 112 exposed on a surface thereof, as shown in FIG. 1B. In some embodiments, the semiconductor chip 110 further has a passivation layer (not shown) covering the contact pads 112, while a portion of each contact pad 112 is exposed through the corresponding opening formed in the passivation layer for electrical connection. The contact pads 112 may be made of or include copper, aluminum, gold, cobalt, titanium, tin, one or more other suitable conductive materials, or a combination thereof. The semiconductor chips 110 may be mounted on and bonded to the package substrate 102 using a flip-chip bonding method, which will be described later.

Each semiconductor chip 110 is a functional IC chip, which may include one or more application processors, logic circuits, memory devices, power management integrated circuits, analog circuits, digital circuits, mixed signal circuits, one or more other suitable functional integrated circuits, or a combination thereof, depending on actual needs.

Figure 7:
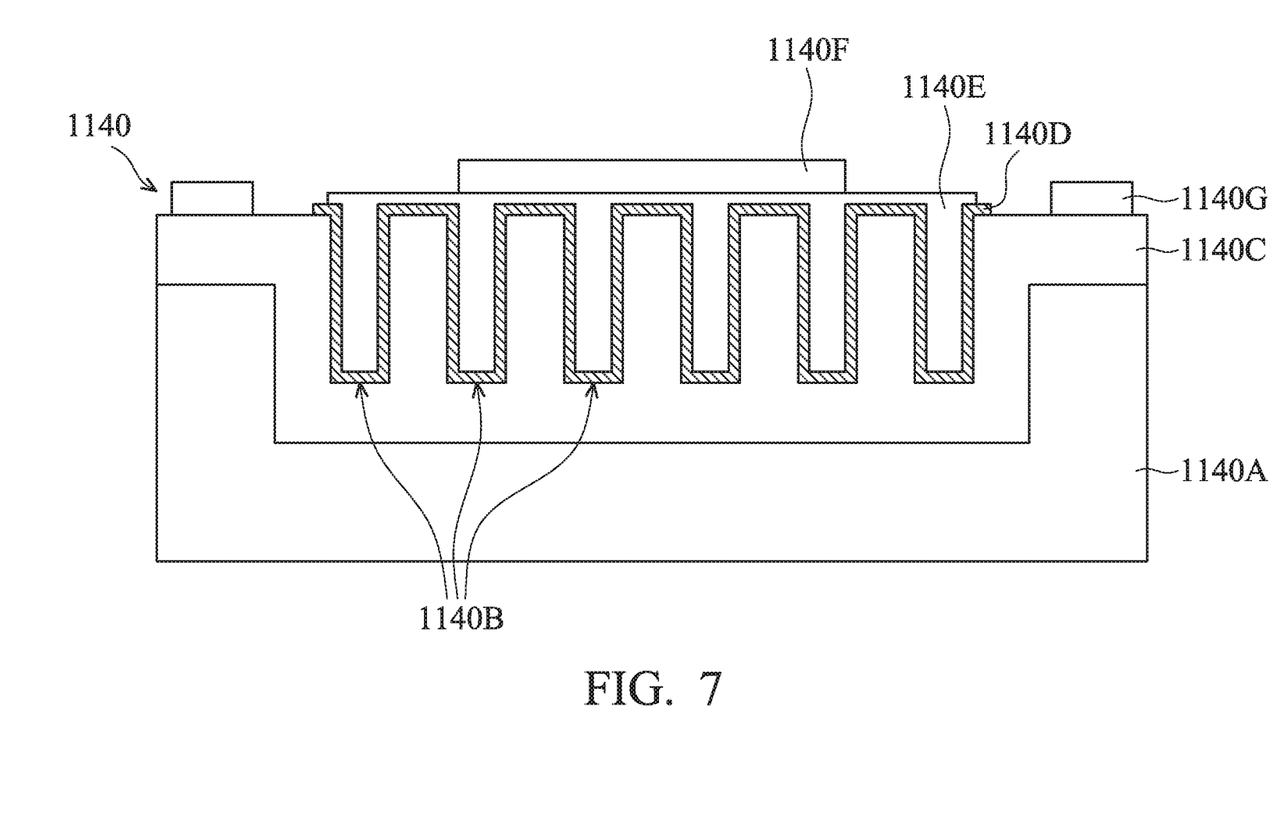
FIG. 7 is a schematic cross-sectional view of the integrated device in FIG. 1B, in accordance with some embodiments.

In some embodiments, one or more integrated devices 114 are integrated with each semiconductor chip 110. For illustration, only one integrated device 114 integrated with one semiconductor chip 110 is described hereinafter in FIG. 1B for simplicity, while the teaching revealed in accordance with the example embodiments are also applicable for cases where multiple integrated devices 114 are integrated with each semiconductor chip 110. In some embodiments, the integrated device 114 is a different type of semiconductor device from the respective semiconductor chip 110. For example, the integrated device 114 may be a passive device including one or more passive elements such as resistors, capacitors, inductors, the like, or a combination thereof. In some embodiments, the integrated device 114 includes at least one deep trench capacitor 1140, the structure of which is shown in FIG. 7. The deep trench capacitor 1140 may include a substrate 1140A and several deep trenches 1140B extending into the interior of the substrate 1140A from the top surface of the substrate 1140A. The deep trench capacitor 1140 also includes a doped layer 1140C formed within the substrate 1140A and surrounding the deep trenches 1140B. A dielectric layer 1140D conformally covers the sidewall and the bottom wall of each deep trench 1140B, and a portion of the dielectric layer 1140D extends to the top surface of the deep trench capacitor 1140. A conductive layer 1140E is disposed over the dielectric layer 1140D, and a portion of the conductive layer 1140E extends into the deep trenches 1140B covered with the dielectric layer 1140D. A first conductive contact 1140F is disposed over and electrically connected to the conductive layer 1140E, and a second conductive contact 1140G is disposed on the top surface of the deep trench capacitor 1140 and electrically connected to the doped layer 1140C. However, embodiments of the disclosure are not limited to the above structure, and other structures of the integrated device 114 are also applicable.

In some embodiments, the integrated device 114 may be an active device including one or more active elements such as diodes, transistors, the like, or a combination thereof. In some embodiments, the integrated device 114 may include a semiconductor die with metallic routing only (i.e., no functional IC chip, active or passive device or module).

As another alternative, the integrated device 114 may be a different type of functional chip from the respective semiconductor chip 110. For example, the semiconductor chip 110 is an application processor, and the integrated device 114 is a memory device, in some cases. In some embodiments, the size (e.g., area) of the integrated device 114 is smaller than the size (e.g., area) of the respective semiconductor chip 110 in top view, which will be described later.

In some embodiments, the integrated device 114 is bonded to the contact pads 112 of the semiconductor chip 110 through conductive structures 116, as shown in FIG. 1B. The conductive structures 116 may be formed on one surface of the integrated device 114 and electrically connected to the exposed pad regions or electrodes (see FIGS. 5A, 5B and 6, for example) of the integrated device 114. The conductive structures 116 are used for electrically interconnecting the integrated device 114 with the semiconductor chip 110. The conductive structures 116 may include conductive pillars, solder balls, controlled collapse chip connection (C4) bumps, micro bumps, one or more other suitable bonding structures, or a combination thereof.

The conductive structures 116 may be made of or include a metal material, such as copper, aluminum, gold, nickel, silver, palladium, or the like, or a combination thereof. The conductive structures 116 may be formed using an electroplating process, an electroless plating process, a placement process, a printing process, a physical vapor deposition (PVD) process, a chemical vapor deposition (CVD) process, a photolithography process, one or more other applicable processes, or a combination thereof.

In some other embodiments, the conductive structures 116 may be made of a tin-containing material. The tin-containing material may further include copper, silver, gold, aluminum, lead, one or more other suitable materials, or a combination thereof. In some other embodiments, the conductive structures 116 are lead-free. In addition, a reflow process may be performed in order to shape the tin-containing material into the desired bump or ball shapes.

In some embodiments, an underfill element 118 is further formed to surround and protect the conductive structures 116, and enhances the connection between the integrated device 114 and the semiconductor chip 110, as shown in FIG. 1B. The underfill element 118 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into a gap between the integrated device 114 and the semiconductor chip 110 to reinforce the strength of the conductive structures 116 and therefore the overall package structure. After the dispensing, the underfill material is cured to form the underfill element 118. The underfill element 118 may also provide a thermal conduction path for the package structure. In this embodiments, the underfill element 118 fills the whole gap between the integrated device 114 and the semiconductor chip 110, and covers all the lower surface of the integrated device 114. In some other embodiments, the underfill element 118 is not formed, or merely covers portions of the lower surface of the integrated device 114.

Figure 1C:
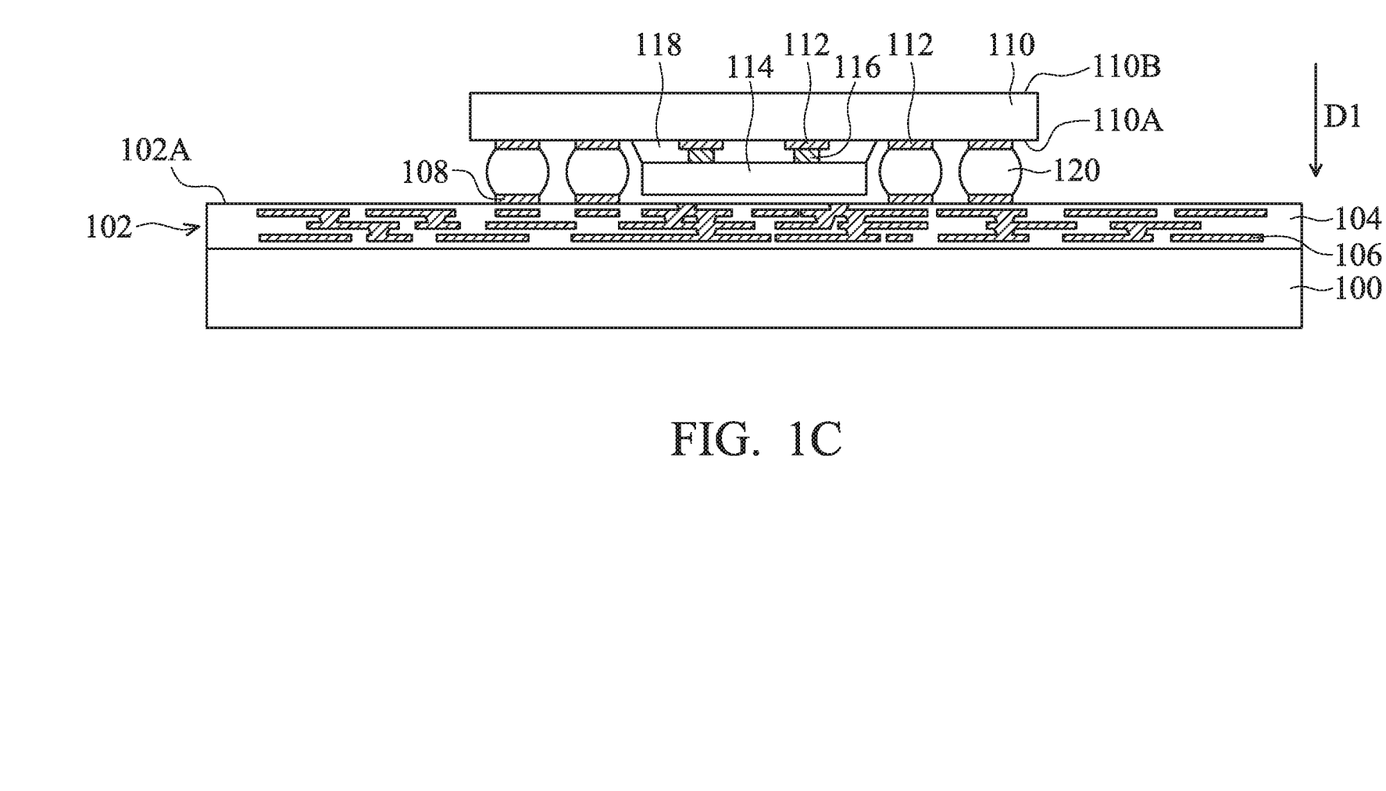

As shown in FIG. 1C, the structure shown in FIG. 1B is turned upside down and disposed over the package substrate 102, in accordance with some embodiments. In some embodiments, after interconnecting with the integrated device 114, the semiconductor chip 110 is placed above the package substrate 102 such that its lower surface 110A (on which the integrated device 114 is mounted) faces and is substantially parallel to the upper surface 102A of the package substrate 102. Afterwards, the semiconductor chip 110 is bonded to the conductive elements 108 over the package substrate 102 through conductive structures 120 between the conductive elements 108 and some contact pads 112 of the semiconductor chip 110 that are not yet coupled to the integrated device 114. In some other embodiments, the conductive elements 108 are not formed, and the semiconductor chip 110 is bonded onto the exposed pad regions (constructed by some of the conductive features 106) of the package substrate 102 through the conductive structures 120.

The conductive structures 120 may include conductive pillars, solder balls, controlled collapse chip connection (C4) bumps, micro bumps, one or more other suitable bonding structures, or a combination thereof. In some embodiments, the materials and formation method of the conductive structures 120 may be the same or similar to those of the conductive structures 116 illustrated in FIG. 1B. In some embodiments, the conductive structures 120 are different from the conductive structures 116 in scheme, size, height, material, or a combination thereof, which will be described later with reference to FIG. 5A.

In some embodiments, the semiconductor chip 110 and the package substrate 102 are pressed against each other at an elevated temperature. As a result, the semiconductor chips 110 are bonded to the package substrate 102 through the conductive structures 120. In some embodiments, a thermal compression process is used to achieve the bonding process mentioned above.

As shown in FIG. 1C, after the semiconductor chip 110 is mounted on and interconnected to the package substrate 102 using the above-mentioned flip-chip bonding method, the conductive structures 120 are located beside the integrated device 114, in accordance with some embodiments. In some embodiments, the integrated device 114 is separated from the upper surface 102A of the package substrate 102 by a gap (see FIG. 1C, for example). The gap (e.g., height) in the direction D1 shown in FIG. 1C may be greater than about 20 μm, but the disclosure is not limited thereto. In some cases, the integrated device 114 may be in direct contact with the upper surface 102A. In some embodiments, the integrated device 114 is surrounded or encircled by the conductive structures 120.

In some embodiments, as shown in FIG. 1C (see also FIG. 2, in which the integrated devices 114 beneath the semiconductor chips 110 are illustrated by dotted lines), each integrated device 114 is located below the respective semiconductor chip 110. For example, each integrated device 114 is located below the respective semiconductor chip 110 without exceeding its boundaries or projection (i.e., the semiconductor chip 110 extends across edges of the integrated device 114) in top view, for example, when viewed in a direction D1 substantially perpendicular to the lower surface 110A of the semiconductor chip 110.

Figure 1D:
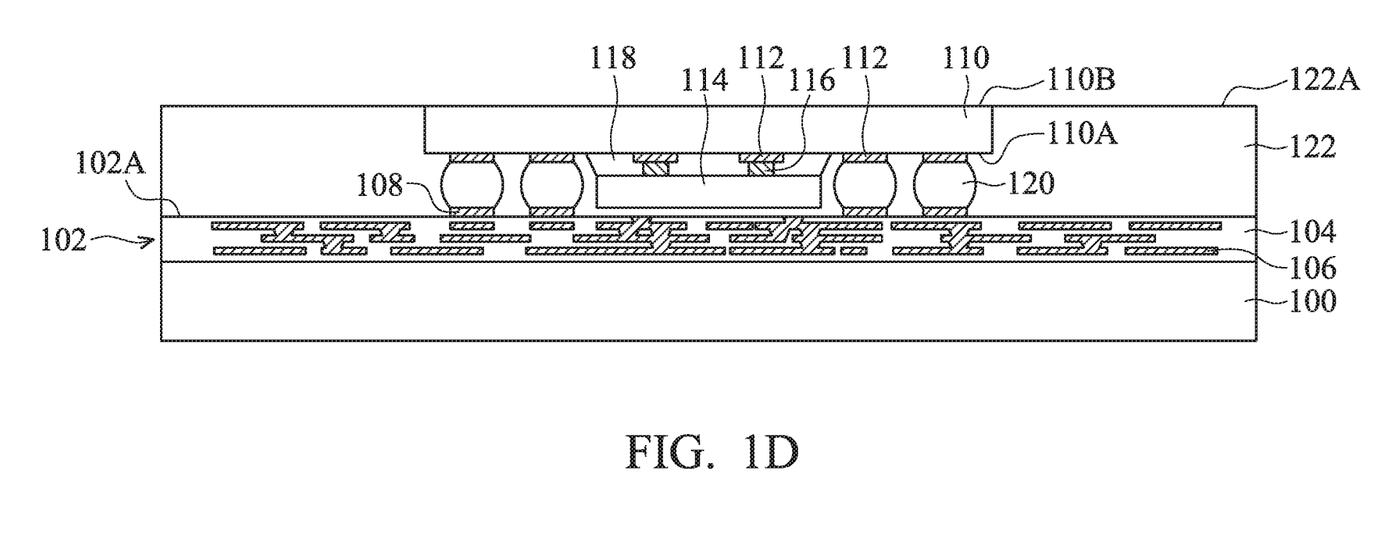

As shown in FIG. 1D, a protective layer 122 is formed to surround and protect the semiconductor chip 110, in accordance with some embodiments. In some embodiments, the protective layer 122 also surrounds and protects the conductive structures 120. In some embodiments, as show in FIG. 1D, a portion of the protective layer 122 is between the lower surface 110A of the semiconductor chip 110 and the upper surface 102A of the package substrate 102, and another portion of the protective layer 122 is between the integrated device 114 and the upper surface 102A of the package substrate 102 (i.e., fills the gap between the integrated device 114 and the package substrate 102). The portion of the protective layer 122 formed between the integrated device 114 and the package substrate 102 helps providing a thermal path for the integrated device 114 (i.e., the heat generated by the operating integrated device 114 may be dissipated through the protective layer 122). In some embodiments, the protective layer 122 is separated from the conductive structures 116 below the respective semiconductor chip 110 by the underfill element 118. However, embodiments of the disclosure are not limited thereto. Many variations and/or modifications can be made to embodiments of the disclosure. In some other embodiments, the underfill element 118 is not formed. In these cases, the protective layer 122 may be in direct contact with the conductive structures 116 below the respective semiconductor chip 110.

In some embodiments, the protective layer 122 is made of or includes an insulating material such as a molding material. The molding material may include a polymer material, such as an epoxy-based resin with fillers dispersed therein. In some embodiments, a molding material (such as a liquid molding material) is dispensed onto the upper surface 102A of the package substrate 102 and/or over the semiconductor chips 110. In some embodiments, a thermal process is then used to cure the liquid molding material and to transform it into the protective layer 122.

In some embodiments, a planarization process is applied on the protective layer 122 to partially remove the protective layer 122. As a result, the upper surface 110B of each semiconductor chip 110 is exposed (i.e., the upper surface 110B of each semiconductor chip 110 is substantially flush with the top surface 122A of the protective layer 122), as shown in FIG. 1D. The planarization process may include a grinding process, a chemical mechanical polishing (CMP) process, an etching process, a dry polishing process, one or more other applicable processes, or a combination thereof.

Figure 1E:
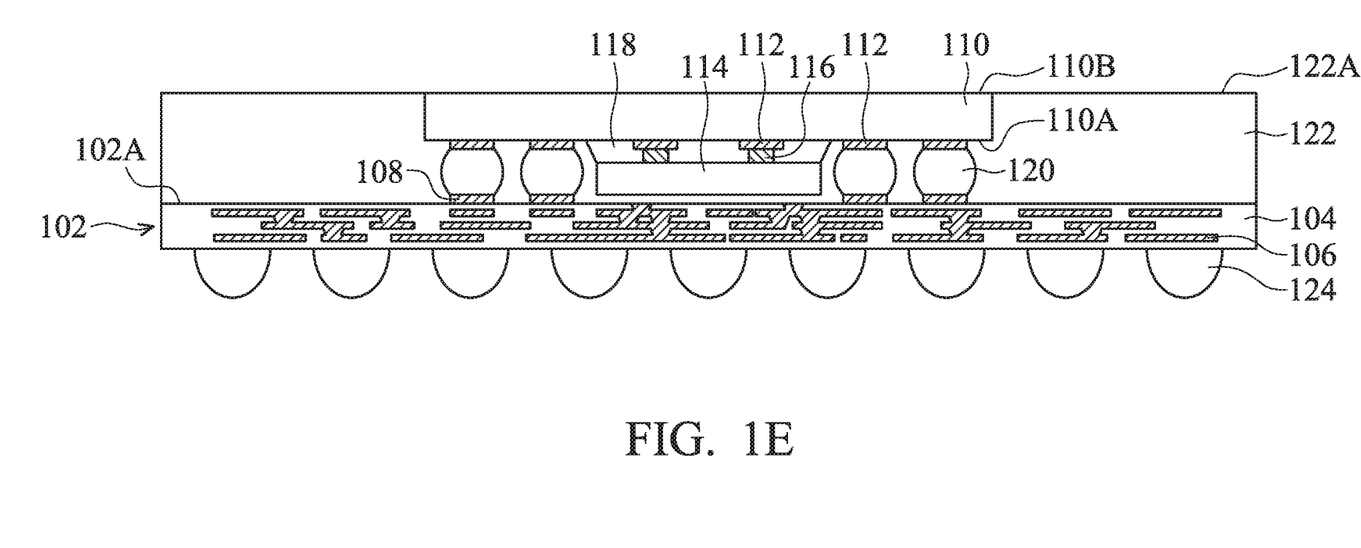

Afterwards, the carrier substrate 100 is removed to expose a surface of the package substrate 102, as shown in FIG. 1E, in accordance with some embodiments. In some embodiments, a release film (not shown) is previously formed over the carrier substrate 100 before the formation of the package substrate 102. The release film is a temporary bonding material, which facilitates the separation operation between the carrier substrate 100 and the package substrate 102.

In some embodiments, conductive bumps 124 are then formed over the surface of the package substrate 102 that is originally covered by the carrier substrate 100, as shown in FIG. 1E. Each conductive bump 124 may be electrically connected to one of the conductive features 106 of the package substrate 102. The conductive bumps 124 enable electrical connection between the package structure and an external device (not shown). The conductive bumps 124 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive features 106 after the removal of the carrier substrate 100. A reflow process is then carried out to melt the solder balls into the conductive bumps 124. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 124.

In some embodiments, a singulation process is then carried out. As a result, multiple separate package structures are formed. In FIG. 1E, one of the package structures is shown. As shown in FIG. 1E, the integrated device 114 is integrated with and bonded to the semiconductor chip 110. Therefore, the semiconductor chip 110 and the integrated device 114 can directly communicate with each other without using another element (e.g., the package substrate 102). As a result, the signal integrity and the power integrity of the package structure are improved due to reduced routing length.

Figure 2:
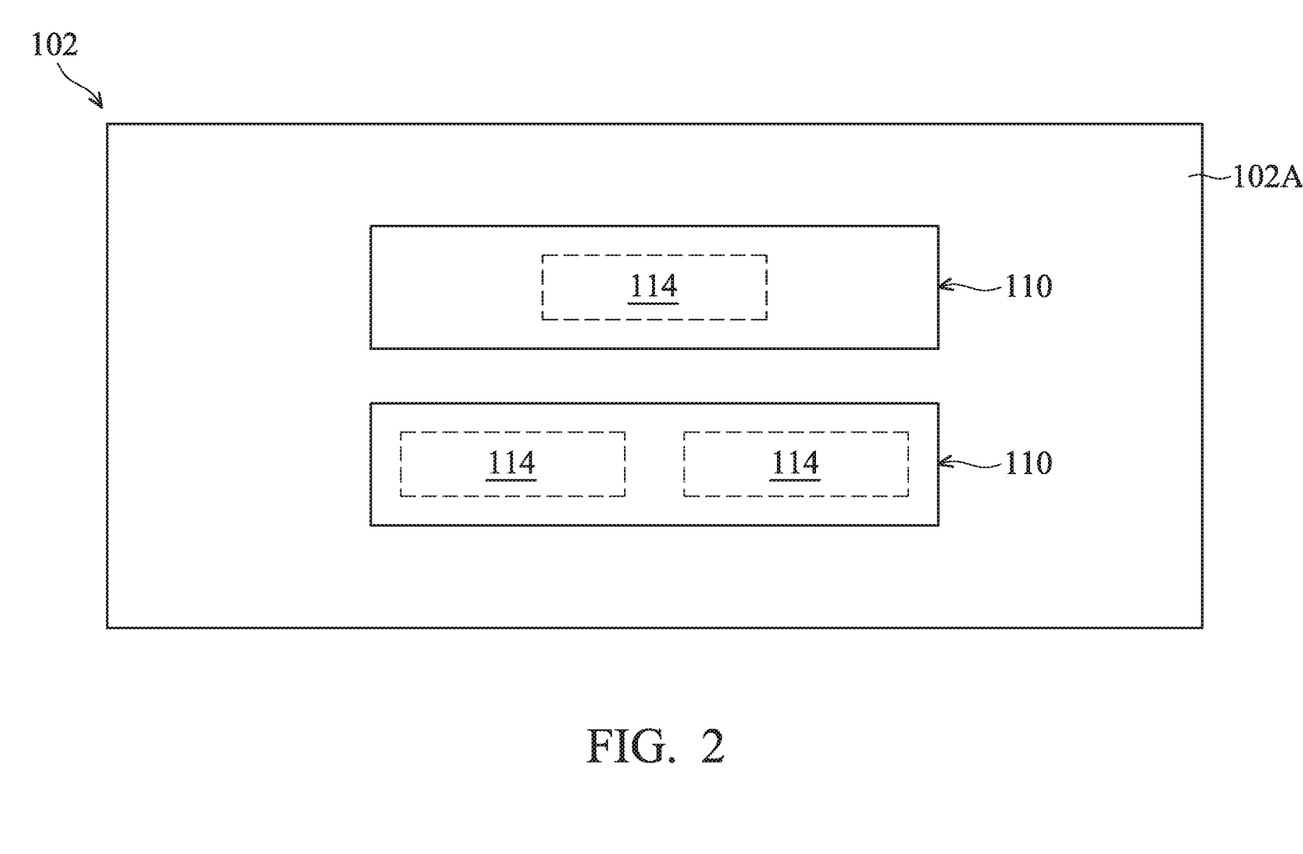
FIG. 2 is a schematic top view of a package structure, in accordance with some embodiments.

In addition, as shown in FIG. 2, since smaller integrated devices 114 can be integrated beneath the respective semiconductor chips 110 and do not take up installation space over the package substrate 102, the size of the package substrate and therefore the size of the overall package structure can be further reduced.

Figure 3:
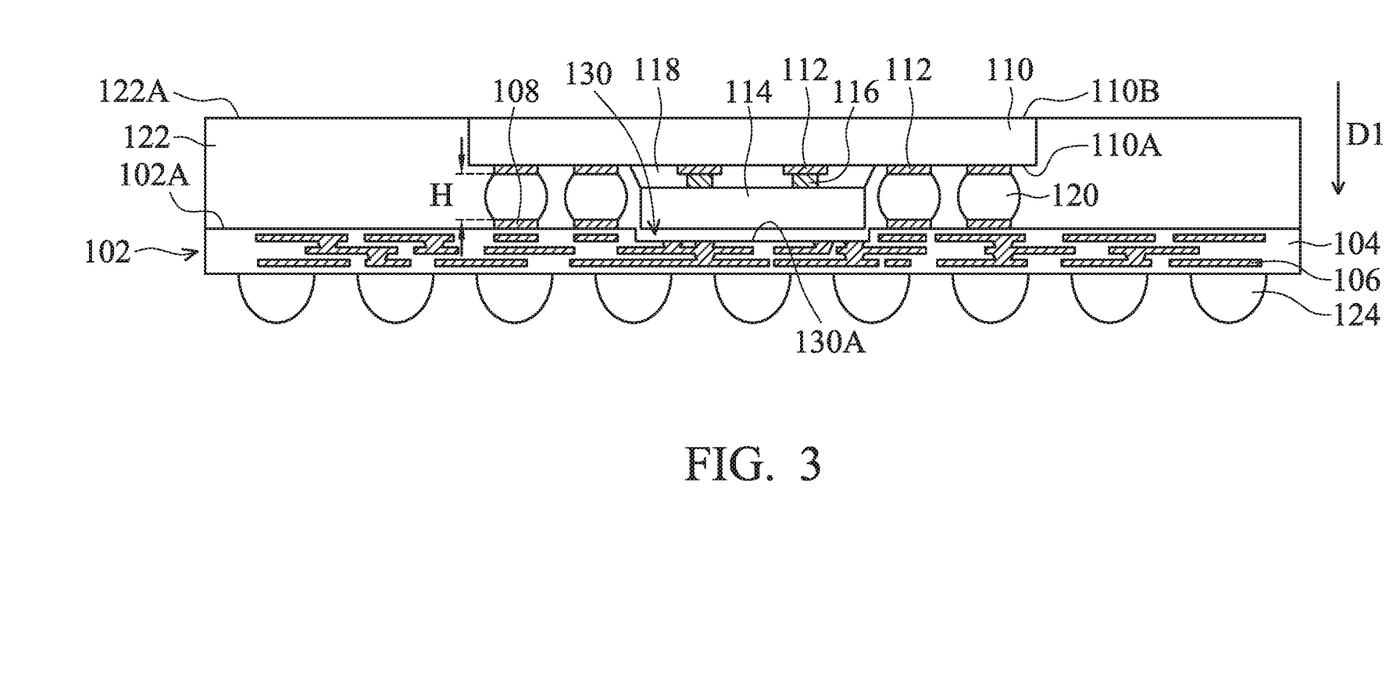
FIG. 3 is a cross-sectional view of a package structure, in accordance with some embodiments.

Many variations and/or modifications can be made to embodiments of the disclosure. FIG. 3 is a cross-sectional view of a package structure, in accordance with some embodiments. It should be appreciated that most of the structures in FIG. 3 are the same as those in FIG. 2, so only the different parts are described here. As shown in FIG. 3, a cavity 130 is further formed on the upper surface 102A of the package substrate 102, in accordance with some embodiments. The cavity 130 may have an appropriate depth (e.g., about 10~30 μm in some cases, but embodiments of the disclosure are not limited thereto) in a direction D1 substantially perpendicular to the upper surface 102A of the package substrate 102 so as to accommodate the integrated device 114 integrated beneath the semiconductor chip 110. Also, the cavity 130 may have a shape and size (e.g., area) corresponding to those of the received integrated device 114 in the section perpendicular to the direction D1 to allow entry of the integrated device 114.

In some embodiments, a portion of the integrated device 114 extends into the cavity 130, and the bottom of the integrated device 114 is separated from the bottom surface 130A of the cavity 130 by a gap, as shown in FIG. 3. The gap (e.g., height) in the direction D1 may be greater than about 20 µm, but the disclosure is not limited thereto. In some embodiments, a portion of the protective layer 122 is between the integrated device 114 and the bottom surface 130A of the cavity 130 (i.e., fills the gap between the integrated device 114 and the bottom surface 130A), so as to provide an additional thermal path for the integrated device 114.

In some other embodiments, the package substrate 102 may have two or more cavities 130, depending on the number of integrated devices 114. For example, one cavity 130 can receive one integrated device 114. However, in some cases, more than one integrated device 114 may be received in one cavity 130.

In some embodiments, the cavity 130 is formed before disposing the semiconductor chip 110 integrated with the integrated device 114 over the package substrate 102. The cavity 130 may be formed using a wet or dry etching process, an energy beam drilling process (such as a laser beam drilling process, an ion beam drilling process, or an electron beam drilling process), a mechanical drilling process, one or more other applicable processes, or a combination thereof. The sidewalls of the formed cavity 130 may be vertical to or inclined relative to the upper surface 102A of the package substrate 102.

In FIG. 3, the cavity 130 is formed on the package substrate 102 to accommodate the integrated device 114, and therefore the height H of the conductive structures 120 in the direction D1 may be smaller than what would be possible using an package substrate 102 without a cavity. This is because the height H of the conductive structures 120 no longer needs to be greater than the thickness of the integrated device 114 in the direction D1. As a result, a thinner overall package structure can be obtained.

Figure 4:
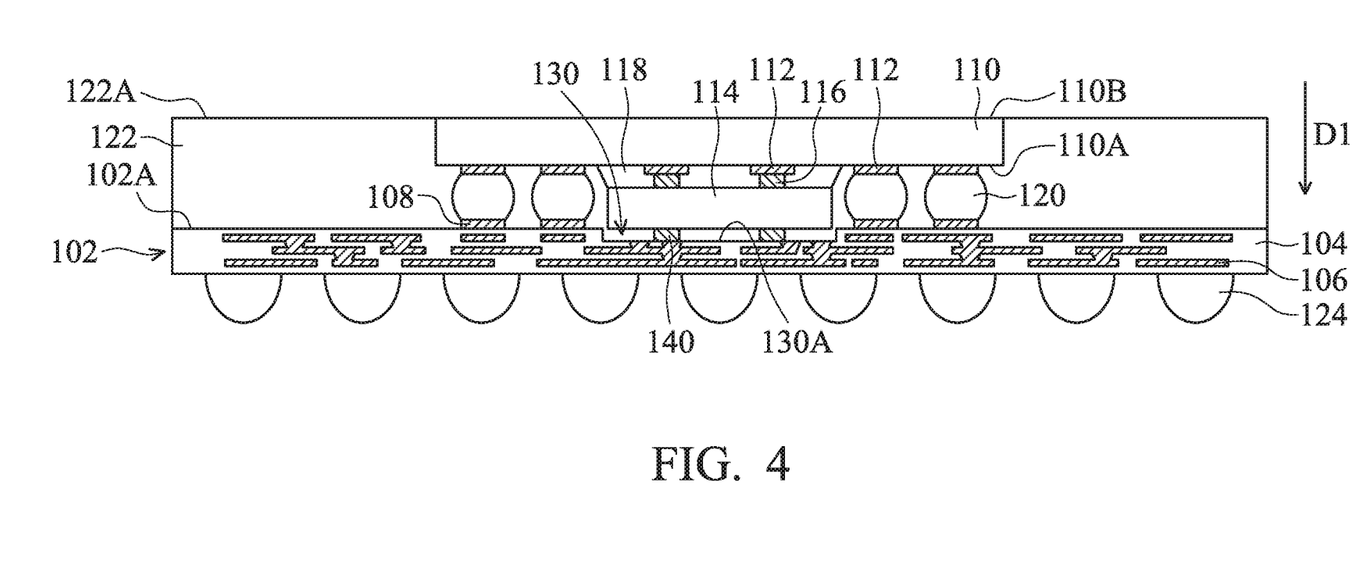
FIG. 4 is a cross-sectional view of a package structure, in accordance with some embodiments.

Many variations and/or modifications can be made to embodiments of the disclosure. FIG. 4 is a cross-sectional view of a package structure, in accordance with some embodiments. It should be appreciated that most of the structures in FIG. 4 are the same as those in FIG. 3, so only the different parts are described here. As shown in FIG. 4, a portion of the integrated device 114 extends into the cavity 130 of the package substrate 102, and the integrated device 114 is further electrically connected to the package substrate 102 at the bottom surface 130A of the cavity 130 through conductive structures 140 between the integrated device 114 and the pad regions (constructed by some of the conductive features 106) exposed at the bottom surface 130A of the cavity 130. The conductive structures 140 enable electrical connection between the integrated device 114 and/or the semiconductor chip 110 and the package substrate 102 after the semiconductor chip 110 integrated with the integrated device 114 is stacked over the package substrate 102.

In some embodiments, before stacking the semiconductor chip 110 over the package substrate 102, the conductive structures 140 are formed on the surface of the integrated device 114 opposite to the conductive structures 116, and are electrically connected to the exposed pad regions or electrodes of the integrated device 114. The conductive structures 140 also electrically connect to the internal circuit of the integrated device 114. For example, several conductive through vias may be formed in and penetrating the integrated device 114 to interconnect the conductive structures 116 and the conductive structures 140 on opposite surfaces of the integrated device 114. The conductive structures 140 may include conductive pillars, solder balls, controlled collapse chip connection (C4) bumps, micro bumps, one or more other suitable bonding structures, or a combination thereof. In some embodiments, the materials and formation method of the conductive structures 140 may be the same or similar to those of the conductive structures 116 illustrated in FIG. 1B. In some embodiments, the conductive structures 140 are also different from the conductive structures 120 in scheme, size, height, material, or a combination thereof, similar to the conductive structures 116 (which will be described later).

In some embodiments, the formed protective layer 122 also surrounds and protects the conductive structures 140 below the integrated device 114. For example, a portion of protective layer 122 is between the integrated device 114 and the bottom surface 130A of the cavity 130, as shown in FIG. 4. The portion of protective layer 122 may also help providing a thermal path for the integrated device 114.

In FIG. 4, the integrated device 114 integrated with the semiconductor chip 110 is also electrically connected to the underlying package substrate 102, thereby providing additional routing for the semiconductor chip 110 to interconnect with the package substrate 102 (in addition to the conductive structures 120). As a result, the electrical performance of the overall package structure is further improved.

Figure 5A:
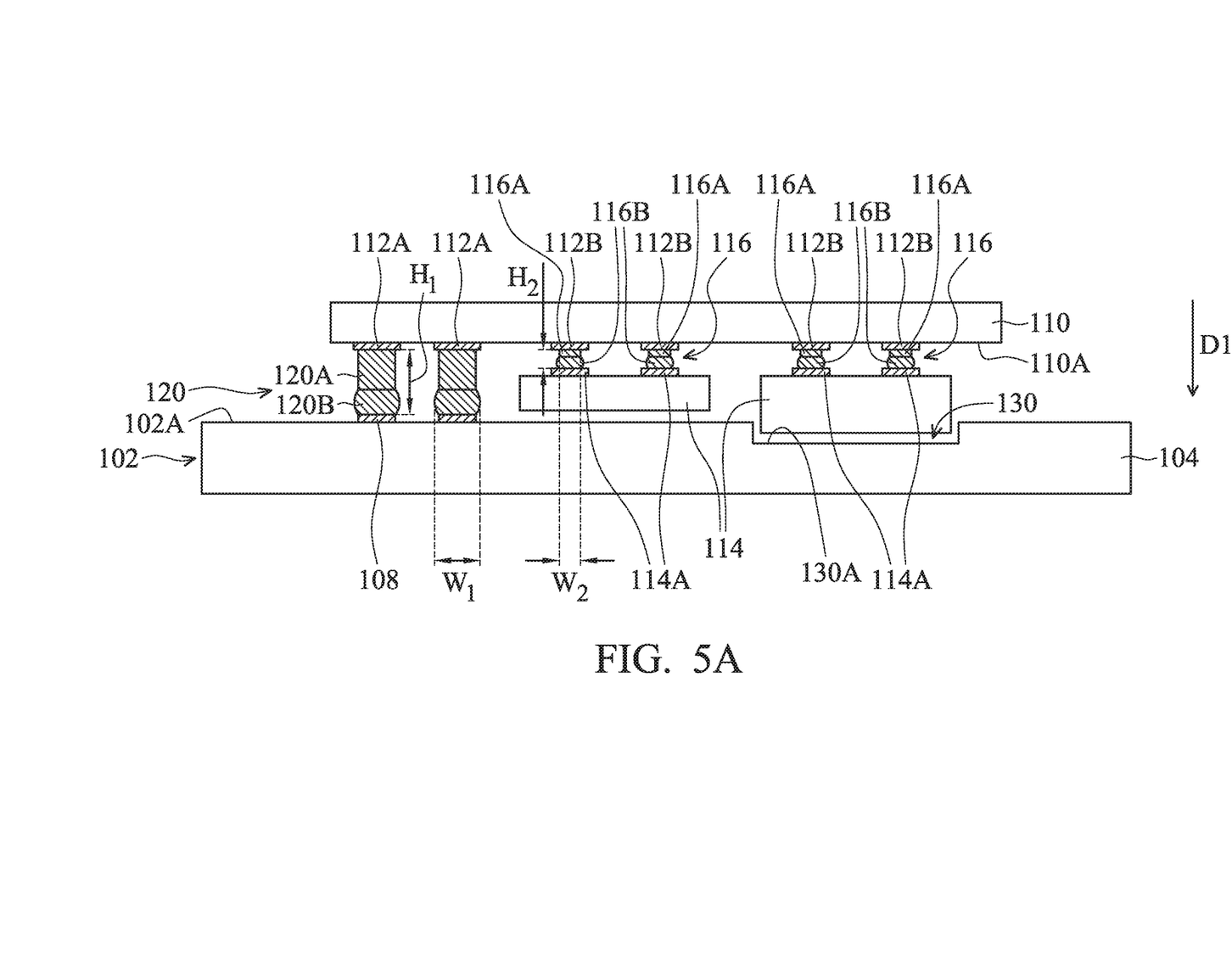
FIG. 5A is a cross-sectional view of a package structure, in accordance with some embodiments.

FIG. 5A is a cross-sectional view of a package structure, in accordance with some embodiments. In some embodiments, FIG. 5A is an enlarged view showing the package structure near the integrated devices 114. As shown in FIG. 5, in some embodiments, the package structure includes two integrated devices 114 of different thicknesses (in the direction D1) integrated beneath the semiconductor chip 110 (i.e., at the lower surface 110A of the semiconductor chip 110 facing the package substrate 102). One integrated device 114 is separated from the upper surface 102A of the package substrate 102 by a gap (e.g., greater than about 20 µm), and the other integrated device 114 extends into a cavity 130 of the package substrate 102 and is separated from the bottom surface 130A of the cavity 130 by a gap (e.g., greater than about 20 µm). However, embodiments of the disclosure are not limited thereto, and at least one of the integrated devices 114 may be in direct contact with the package substrate 102 in some other embodiments.

As shown in FIG. 5, in some embodiments, the package structure also includes conductive structures 120 for interconnecting the semiconductor chip 110 to the package substrate 102, and conductive structures 116 for interconnecting the semiconductor chip 110 with the integrated devices 114. The materials and formation method of the conductive structures 120 may be the same or similar to those of the conductive structures 120 illustrated in FIG. 1C. The materials and formation method of the conductive structures 116 may be the same or similar to those of the conductive structures 116 illustrated in FIG. 1B.

The conductive structures 120 and 116 may have different schemes and/or materials, in accordance with some embodiments. For example, in some embodiments, each conductive structure 120 includes a metal pillar 120A (also called C4 bump) made of a metallic material (e.g., copper, gold or the like, or an alloy thereof) and a solder ball 120B, while each conductive structure 116 includes a conductive connector 116A (also called micro bump) made of a metallic material (e.g., copper, gold or the like, or an alloy thereof) different from or the same as that for the metal pillar 120A and a solder ball 116B, as shown in FIG. 5A. The metal pillar 120A is bonded onto one contact pad 112A of the semiconductor chip 110, and the solder ball 120 is formed between the metal pillar 120A and one conductive element 108 over the package substrate 102. The conductive connector 116A is formed onto one contact pad 112B of the semiconductor chip 110, and the solder ball 116B is formed between the conductive connector 116A and one contact pad or electrode 114A of the integrated device 114. In some other embodiments, under bump metallization (UBM) elements are formed over the contact pads 112A of the semiconductor chip 110 before the conductive structures 120 are disposed. In some other embodiments, the conductive connectors 116A are omitted, and the solder balls 116B are formed between some contact pads 112B of the semiconductor chip 110 and the corresponding contact pads or electrodes 114A of the integrated device 114.

In addition, the conductive structures 120 and 116 may have different sizes and/or heights, in accordance with some embodiments. For example, in some embodiments as shown in FIG. 5A, the height H1 (e.g., about 70~120 μm) of each conductive structure 120 in the direction D1 is greater than the height H2 (e.g., about 10~30 μm) of each conductive structure 116 in the direction D1. Additionally or alternatively, the size $W_1$ (e.g., area) of each conductive structure 120 in the section perpendicular to the direction D1 is greater than the size $W_2$ (e.g., area) of each conductive structure 116 in the section perpendicular to the direction D1. In some embodiments, the size of each contact pad 112A of the semiconductor chip 110 for the conductive structure 120 is also greater than the size of each contact pad 112B for the conductive structure 116, as shown in FIG. 5.

It should be understood that the materials, structures and geometries of the conductive structures 120 and 116 described above are only illustrative, and are not intended to be, and should not be construed to be, limiting to the present disclosure. Many alternatives and modifications will be apparent to those skilled in the art, once informed by the present disclosure.

Figure 5B:
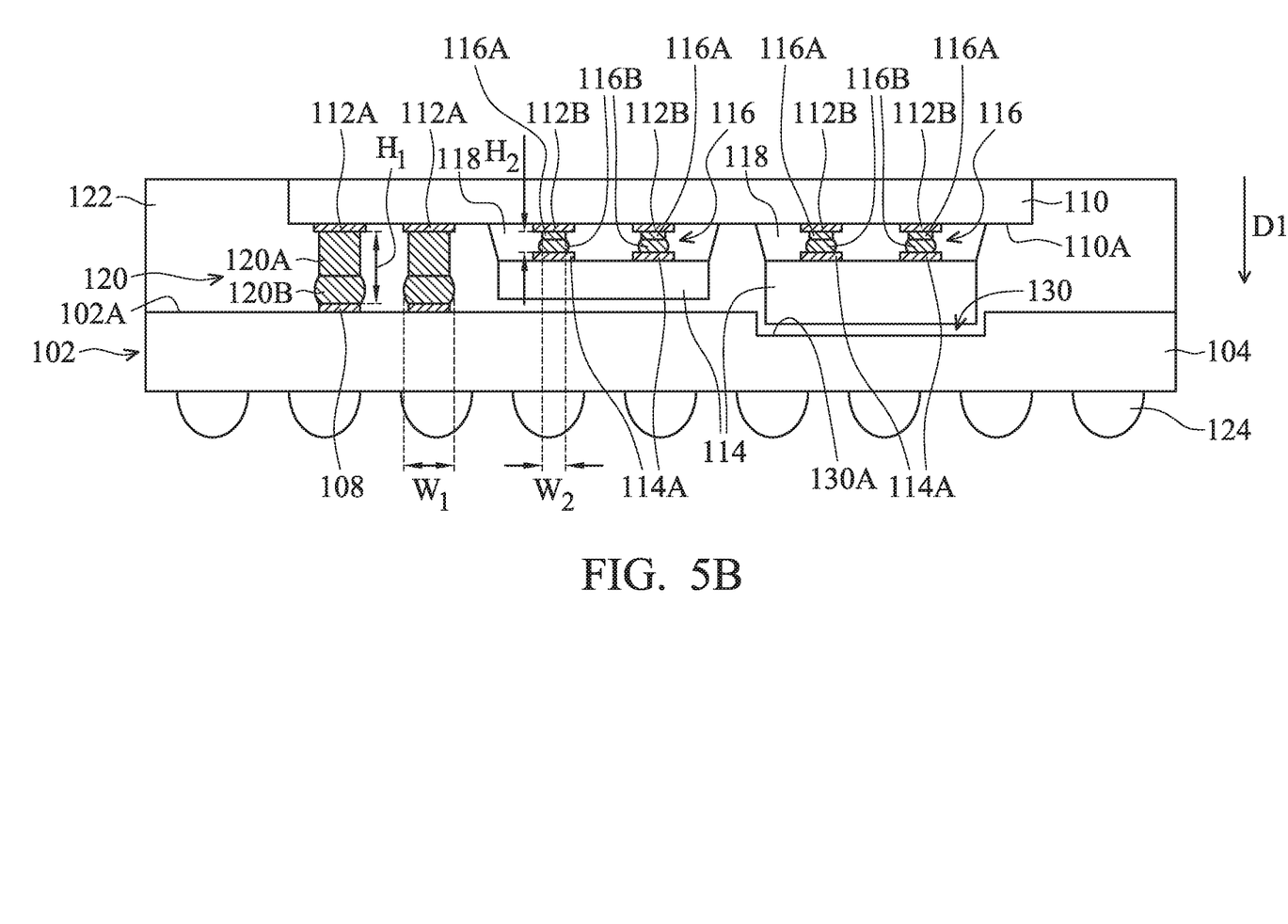
FIG. 5B is a cross-sectional view of a package structure, in accordance with some embodiments.

In some embodiments, as shown in FIG. 5B, the above-mentioned protective layer 122 may be formed to surround and protect the semiconductor chip 110, and the underfill element 118 is optionally formed to surround and protect the conductive structures 116. A portion of protective layer may be formed between the integrated device 114 and the bottom surface 130A of the cavity 130.

Figure 6:
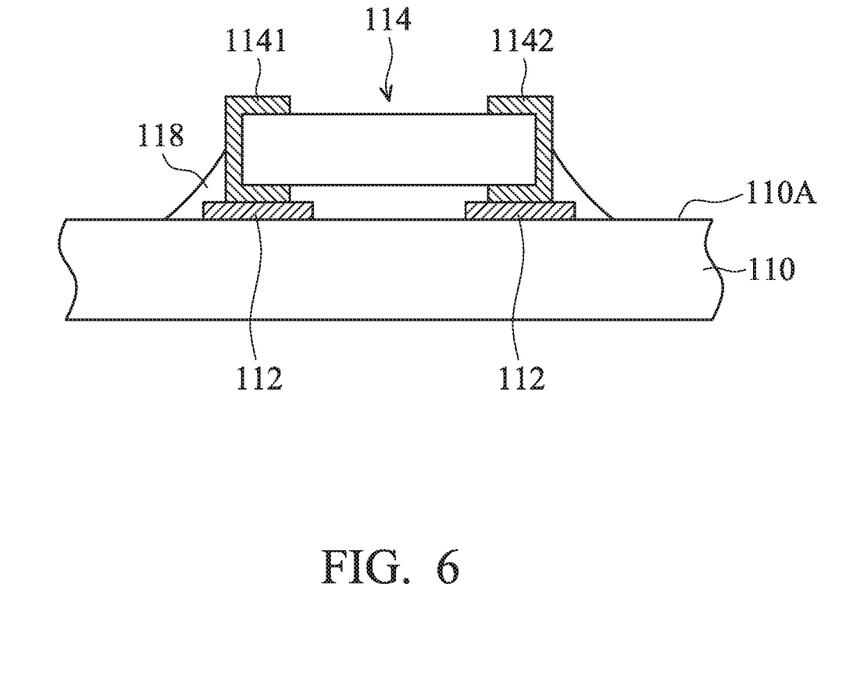
FIG. 6 is a cross-sectional view of a package structure, in accordance with some embodiments.

FIG. 6 is a cross-sectional view of a package structure, in accordance with some embodiments. In some embodiments, FIG. 6 is an enlarged view showing the package structure about the integrated device 114 which may be applicable to embodiments of FIGS. 1-4 and 5. As shown in FIG. 6, in some embodiments, the integrated device 114 includes electrodes 1141 and 1142. In some embodiments, the cross-sectional view of the electrodes 1141 and 1142 have C-shape profile, as shown in FIG. 6. The electrodes 1141 and 1142 may be bonded to (e.g., solder jointed to or directly contact) the contact pads 112 of the semiconductor chip 110. In some embodiments, an underfill element 118 is formed to surround and protect the joint between the electrodes 1141 and 1142 and the contact pads 112. In some embodiments, the electrodes 1141 and 1142 may have other profile, such as rectangular shape.

Embodiments of the disclosure form a package structure including a package substrate, a semiconductor chip over the package substrate, and at least one integrated device integrated with the semiconductor chip. The integrated device is integrated directly beneath the semiconductor chip in order to facilitate signal transmission. Consequently, the signal integrity and the power integrity of the package structure are improved. In addition, the integrated device does not take up installation space over the package substrate, which means that the size of the package substrate and of the overall package structure can also be reduced.

In accordance with some embodiments, a package structure is provided. The package structure includes a package substrate, a semiconductor chip and an integrated device. The semiconductor chip is disposed over the package substrate and has a lower surface facing the package substrate. The integrated device is disposed between the package substrate and the semiconductor chip and bonded to the lower surface of the semiconductor chip.

In accordance with some embodiments, a method for forming a package structure is provided. The method includes bonding an integrated device to a semiconductor chip. The method further includes disposing the semiconductor chip with the integrated device over a package substrate so that the integrated device is between the lower surface of the semiconductor chip and the upper surface of the package substrate.

In accordance with some embodiments, a package structure is provided. The package structure includes a package substrate, a semiconductor chip and an integrated device. The semiconductor chip is bonded to the upper surface of the package substrate through a plurality of first conductive structures between the upper surface of the package substrate and the lower surface of the semiconductor chip. The integrated device is bonded to the lower surface of the semiconductor chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
    a package substrate;
    a semiconductor chip disposed over the package substrate, wherein the semiconductor chip has a lower surface facing the package substrate and is electrically connected to the package substrate through conductive structures, wherein the conductive structures are bonded onto and in direct contact with contact pads formed on the lower surface; and
    an integrated device disposed between the package substrate and the semiconductor chip and bonded to the lower surface of the semiconductor chip, wherein the integrated device is laterally surrounded by the conductive structures.
2. The package structure as claimed in claim 1, wherein the integrated device is located below the semiconductor chip, and is located within boundaries of the semiconductor chip when viewed in a direction perpendicular to the lower surface of the semiconductor chip.

3. The package structure as claimed in claim 1, wherein the integrated device is electrically connected to the semiconductor chip through second conductive structures between the lower surface of the semiconductor chip and the integrated device.

4. The package structure as claimed in claim 3, further comprising an underfill element configured to surround the second conductive structures, wherein a portion of the underfill element is between the lower surface of the semiconductor chip and the integrated device.

5. The package structure as claimed in claim 4, further comprising a protective layer configured to surround the semiconductor chip and the integrated device, wherein the protective layer is separated from the second conductive structures by the underfill element.

6. The package structure as claimed in claim 1, further comprising a protective layer configured to surround the plurality of conductive structures and the integrated device.

7. The package structure as claimed in claim 1, wherein the integrated device is separated from an upper surface of the package substrate by a gap.

8. The package structure as claimed in claim 1, wherein the package substrate has an upper surface facing the lower surface of the semiconductor chip and a cavity formed on the upper surface, wherein the cavity is configured to accommodate the integrated device.

9. The package structure as claimed in claim 8, wherein the integrated device is an integrated passive device.

10. The package structure as claimed in claim 8, wherein the integrated device extends into the cavity and is electrically connected to the package substrate at a bottom surface of the cavity.

11. The package structure as claimed in claim 1, wherein the integrated device is a different type of semiconductor device from the semiconductor chip.

12. A method for forming a package structure, comprising:
bonding an integrated device to a semiconductor chip;
disposing the semiconductor chip with the integrated device over a package substrate so that the integrated device is between a lower surface of the semiconductor chip and an upper surface of the package substrate; and
forming a cavity on the upper surface of the package substrate to accommodate the integrated device, before disposing the semiconductor chip with the integrated device over the Package substrate.

13. The method as claimed in claim 12, wherein the integrated device is bonded on the lower surface of the semiconductor chip through conductive structures, wherein before disposing the semiconductor chip with the integrated device over the package substrate, the method further comprises forming an underfill element to surround the conductive structures.

14. The method as claimed in claim 12, wherein after disposing the semiconductor chip with the integrated device over the package substrate, the integrated device is separated from the upper surface of the package substrate by a gap.

15. The method as claimed in claim 12, wherein after disposing the semiconductor chip with the integrated device over the package substrate, the method further comprises electrically connecting the integrated device to the package substrate at a bottom surface of the cavity through conductive structures between the integrated device and the bottom surface of the cavity.

16. A package structure, comprising:
a package substrate;
a semiconductor chip bonded to an upper surface of the package substrate through a plurality of first conductive structures between the upper surface of the package substrate and a lower surface of the semiconductor chip;
an integrated device bonded to the lower surface of the semiconductor chip; and
a protective layer configured to surround the plurality of first conductive structures and the integrated device, wherein a portion of the protective layer is between the lower surface of the semiconductor chip and the upper surface of the package substrate, and another portion of the protective layer is between the integrated device and the upper surface of the package substrate.

17. The package structure as claimed in claim 16, wherein the integrated device is bonded to the lower surface of the semiconductor chip through a plurality of second conductive structures between the lower surface of the semiconductor chip and the integrated device.

18. The package structure as claimed in claim 17, wherein the plurality of second conductive structures is different from the plurality of first conductive structures in scheme, size, height, material or a combination thereof.

19. The package structure as claimed in claim 16, wherein the integrated device is located directly below the semiconductor chip, and is located within boundaries of the semiconductor chip when viewed in a direction perpendicular to the lower surface of the semiconductor chip.

20. The package structure as claimed in claim 16, wherein the protective layer is also configured to surround the semiconductor chip, and a top surface of the semiconductor chip is flush with a top surface of the protective layer.

* * * * *